(12) United States Patent
Chikaki (10) Patent No.: US 7,699,085 B2
(45) Date of Patent: Apr. 20, 2010

(54) LAMINATING APPARATUS

(75) Inventor: Yoshiro Chikaki, Tokyo (JP)

(73) Assignee: NPC Incorporated, Tokyo (JP)

( * ) Notice: Subject to any disclaimer, the term of this patent is extended or adjusted under 35 U.S.C. 154(b) by 168 days.

(21) Appl. No.: 11/979,401

(22) Filed: Nov. 2, 2007

(65) Prior Publication Data

US 2008/0105381 A1    May 8, 2008

(30) Foreign Application Priority Data

Nov. 7, 2006 (JP) ............................. 2006-301942

(51) Int. Cl.
*B32B 37/06* (2006.01)
(52) U.S. Cl. .................... 156/382; 156/285; 156/583.3; 156/583.5
(58) Field of Classification Search ......... 156/538–579, 156/581, 582, 285, 286, 382, 583.3, 583.5; 198/809
See application file for complete search history.

(56) References Cited

U.S. PATENT DOCUMENTS 3,730,330 A * 5/1973 De Good ............... 198/781.09

| | | | |
|---|---|---|---|
| 6,149,757 A | 11/2000 | Chikaki et al. | |
| 2005/0056363 A1 | 3/2005 | Takeyama | |
| 2006/0199131 A1* | 9/2006 | Kawasaki et al. ........... | 432/120 |

FOREIGN PATENT DOCUMENTS

| | | |
|---|---|---|
| EP | 1 550 548 A1 | 7/2005 |
| JP | 09-141 743 A | 6/1997 |
| JP | 10-95089 A | 4/1998 |
| JP | 2001-239144 A | 9/2001 |
| JP | 2006-035789 A | 2/2006 |

OTHER PUBLICATIONS

European Search Report, App. No. 07021476.2-1528, May 28, 2008 (6 pages).

* cited by examiner

*Primary Examiner*—Kat Wyrozebski
*Assistant Examiner*—Scott W Dodds
(74) *Attorney, Agent, or Firm*—Rader, Fishman & Grauer, PLLC (57) ABSTRACT

There is provided a laminating apparatus laminating an object to be laminated in a laminating part which has a diaphragm on an upper side and a heater panel on a lower side, by melting a filler in the object to be laminated and pressing the object to be laminated sandwiched between the diaphragm and the heater panel, the apparatus including: a sheet conveying the object to be laminated placed thereon to/out of the laminating part; and a lift mechanism lifting up/down a support part capable of supporting the sheet from the lower side.

4 Claims, 9 Drawing Sheets

LAMINATING APPARATUS

BACKGROUND OF THE INVENTION

1. Field of the Invention

The present invention relates to a laminating apparatus particularly suitable for producing a laminated object in a thin plate shape such as a solar battery module.

2. Description of the Related Art

In recent years, various developments have been made on solar batteries with the aim of effective use of solar energy. Further, beside crystal type solar batteries using single crystal silicon or polycrystalline silicon, various types of solar batteries have been contrived, such as amorphous solar batteries using amorphous silicon (noncrystalline silicon). However, since silicon itself in any of these crystalline and amorphous types is subject to chemical change and has low resistance against a physical impact, a solar battery module in which silicon is laminated with a transparent vinyl film, tempered glass, heat-resistant glass, or the like is generally used.

Further, for use as building materials, an integrated module and the like in which an exterior wall material or a roof material is integrated with a solar battery module have come to be produced in recent years. A method to laminate a solar battery module is to interpose strings (solar battery cells) between a vinyl film or glass and a back sheet via a filler such as, for example, EVA (ethylene vinyl acetate) resin, and melt the filler by temperature given by heating under vacuum.

Conventionally, as a laminating apparatus for producing such solar battery modules and the like, there has been known a laminating apparatus which laminates an object to be laminated in a laminating part having a diaphragm on an upper side and a heater panel on a lower side, by melting a filler inside the object to be laminated and pressing the object to be laminated sandwiched between the diaphragm and the heater panel (see Japanese Patent Application Laid-open No. 2001-239144). In the laminating apparatus described in Japanese Patent Application Laid-open No. 2001-239144, when the object to be laminated is loaded/unloaded to/out of the laminating part which has an upper chamber including the diaphragm expandable downward and a lower chamber including the heater panel, the object to be laminated is placed on a sheet and moved by the sheet.

SUMMARY OF THE INVENTION

However, in recent years, because objects to be laminated have become larger and because a plurality of, for example, three to four objects to be laminated are simultaneously laminated for improved production efficiency, an object to be laminated placed on a sheet has to be moved very long when loaded to a laminating part. Accordingly, the object to be laminated moves above a heater in the laminating part for a longer time when loaded into the laminating part, and consequently, is heated by the heater as it moves. This has posed the following problem in loading a plurality of objects to be laminated. That is, an object to be laminated carried to a deeper position first is heated for a longer time to become higher in temperature than an object to be laminated carried to a front position later, resulting in uneven temperature among the plural simultaneously treated objects to be laminated. Moreover, if the filler in the object to be laminated is melted by this heating before the laminating treatment, air enters the inside of the object to be laminated, which may possibly lower quality of a produced solar battery module or the like.

The present invention was made in view of the aforesaid problems, and its object is to provide a laminating apparatus capable of preventing an object to be laminated from being heated before laminated, thereby improving quality of the object to be laminated such as a solar battery module.

To solve the aforesaid problems, according to the present invention, there is provided a laminating apparatus laminating an object to be laminated in a laminating part which has a diaphragm on an upper side and a heater panel on a lower side, by melting a filler in the object to be laminated and pressing the object to be laminated sandwiched by the diaphragm and the heater panel, the, apparatus including: a conveying sheet operative for conveying the object to be laminated placed on the conveying sheet into and out of the laminating part; and a lift mechanism operative for lifting up/down a support part capable of supporting the conveying sheet from the lower side.

In the laminating apparatus, the lift mechanism may have the support part in plurality, and the plural support parts may be coupled to a common support plate moving up/down under the heater panel.

In the laminating apparatus, the support part may have a shape which is long in a loading/unloading direction of the object to be laminated.

In the laminating apparatus, in an upper surface of the support part, longitudinal both end portions may be lower than a longitudinal center portion.

In the laminating apparatus, the support part may be housed in the heater panel when in a lowered state.

In the laminating apparatus, the object to be laminated may be a solar battery module.

According to the present invention, it is possible to prevent an object to be laminated from being heated by heat of a heater when the object to be laminated is loaded into a laminating part. This can prevent the entrance of air into the object to be laminated which might occur if the object to be laminated should be heated before laminated, and therefore, it is possible to produce a high-quality laminated object such as a solar battery module.

DETAILED DESCRIPTION OF THE INVENTION

Hereinafter, a preferred embodiment of the present invention will be described based on a laminating apparatus 1 suitable for laminating a solar battery module M as an example of an object to be laminated. In the specification and the drawings, elements having substantially the same functions and structures will be denoted by the same reference numerals, and redundant description thereof will be omitted.

Figure 1:
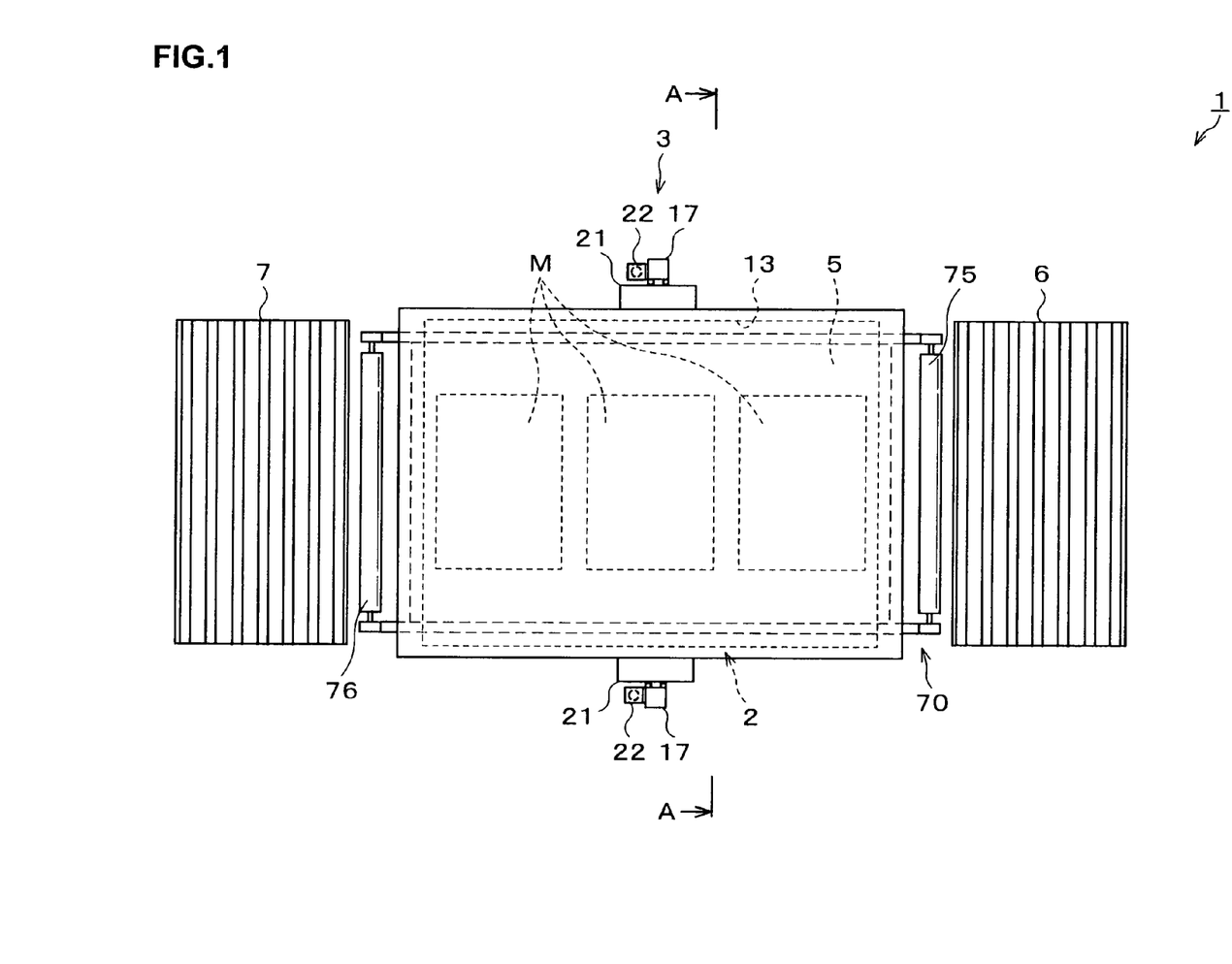
FIG. 1 is a plane view of a laminating apparatus according to an embodiment of the present invention.
Figure 2:
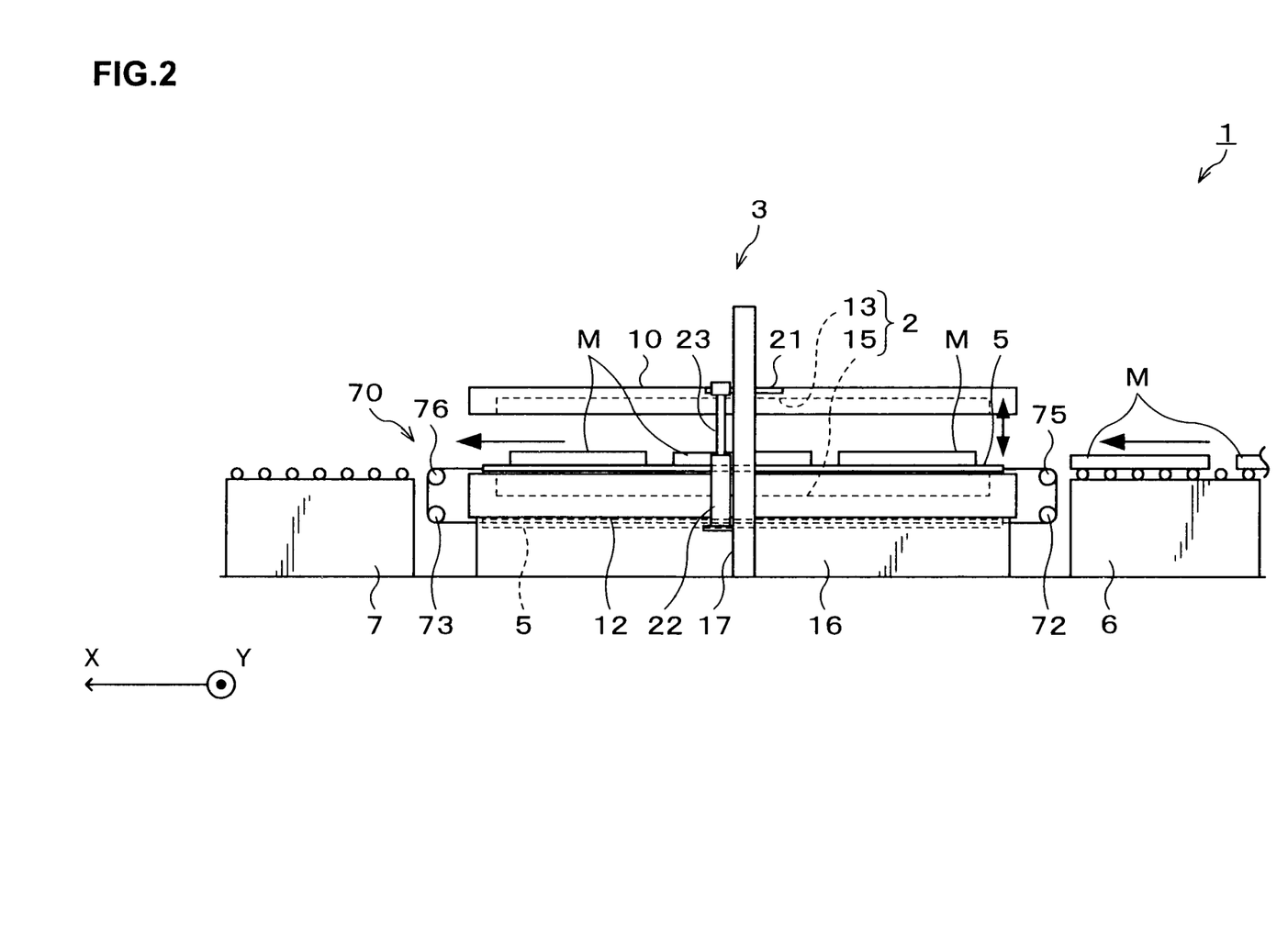
FIG. 2 is a side view of the laminating apparatus according to the embodiment of the present invention.

FIG. 1 is a plane view of the laminating apparatus 1 according to the embodiment of the present invention. FIG. 2 is a side view of the laminating apparatus 1 according to the embodiment of the present invention. As shown in FIG. 1 and FIG. 2, the laminating apparatus 1 includes a laminating unit 3 which has therein a laminating part 2. The laminating part 2 is capable of simultaneously laminating a plurality of (for example, three) objects to be laminated. Further, the laminating part 2 is formed large enough to laminate an object to be laminated which is about 2150 mm wide in a right and left direction and about 4000 mm wide in a front and rear direction, at the maximum.

The laminating apparatus 1 includes a conveying sheet 5 conveying, for example, three solar battery modules M placed thereon into the laminating unit 3, and conveying, out of the laminating unit 3, the solar battery modules M which have been laminated. On the right of the laminating unit 3, provided is a supply conveyor 6 from which the solar battery modules M to be laminated are conveyed toward the laminating unit 3. On the left of the laminating unit 3, provided is an unloading conveyor 7 to which the solar battery modules M are unloaded out of the laminating unit 3. For example, three solar battery modules M are conveyed leftward in FIG. 1 and FIG. 2 as they are transferred to the supplier conveyor 6, the conveying sheet 5, and the unloading conveyor 7 in sequence.

As shown in FIG. 2, the laminate unit 3 includes an upper case 10 and a lower case 12. An upper chamber 13 is formed inside, i.e., on a lower side of the upper case 10, and a lower chamber 15 is formed inside, i.e., on an upper side of the lower case 12. The laminating part 2 is constituted of the upper chamber 13 and the lower chamber 15.

The lower case 12 is fixedly supported on an upper side of a base 16. Brackets 21 are provided to be movable along support pillars 17 erected on a front side and a back side (a near side and a far side in FIG. 2) of the base 16, and a front side and a back side of the upper case 10 are fixed to the brackets 21. This structure allows the upper case 10 to move up/down along the support pillars 17, and to move up/down above the lower case 12 while kept parallel with the lower case 12.

Hydraulic cylinders 22 are attached to sides of the respective support pillars 17, and tips of piston rods 23 of the cylinders 22 are connected to lower surfaces of the brackets 21 fixed to the upper case 10. Accordingly, when the piston rods 23 extend by the operation of the cylinders 22, the upper case 10 moves up to separate from an upper surface of the lower case 12, so that the laminating part 2 constituted of the upper chamber 13 and the lower chamber 15 becomes open. On the other hand, when the piston rods 23 contract by the operation of the cylinders 22, the upper case 10 moves down to come into close contact with the upper surface of the lower case 12, so that the laminating part 2 is hermetically closed.

Figure 3:
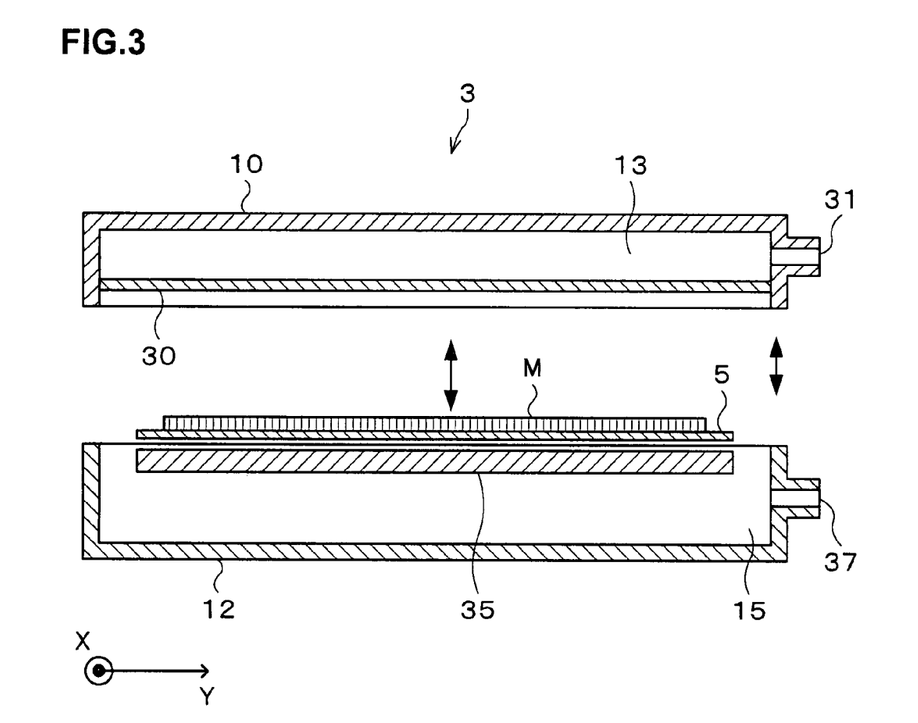
FIG. 3 is a sectional view taken along the arrows A-A in FIG. 1.

FIG. 3 is a sectional view taken along the arrows A-A in FIG. 1. An arrow direction X shown in FIG. 3 is a loading/unloading direction in which the solar battery modules M are loaded into or unloaded out of the laminating part, and an arrow direction Y perpendicular to the loading/unloading direction X is a width direction of the heater panel 35. As shown in FIG. 3, a diaphragm 30 is fitted so as to horizontally partition the inside of the upper case 10, and a first space enclosed by the diaphragm 30 and an inner wall surface of the upper case 10 constitutes the upper chamber 13. As the diaphragm 30, a silicon diaphragm, a butyl diaphragm, or the like is used, for instance. An inlet/outlet port 31 is provided in a side surface of the upper case 10 to communicate with the upper chamber 13, so that the inside of the upper chamber 13 can be evacuated through the inlet/outlet port 31 and atmospheric pressure can be introduced into the upper chamber 13 through the inlet/outlet port 31.

The heater panel 35 is disposed inside a second space enclosed by the diaphragm 30 and an inner wall surface of the lower case 12. The heater panel 35 is structured such that heaters (not shown) are provided inside a metal plate 36 made of, for example, aluminum. An inlet/outlet port 37 is provided in a side surface of the lower case 12 so as to communicate with the lower chamber 15, so that the inside of the lower chamber 15 can be evacuated through the inlet/outlet port 37 and atmospheric pressure can be introduced into the lower chamber 15 through the inlet/outlet port 37.

Figure 4:
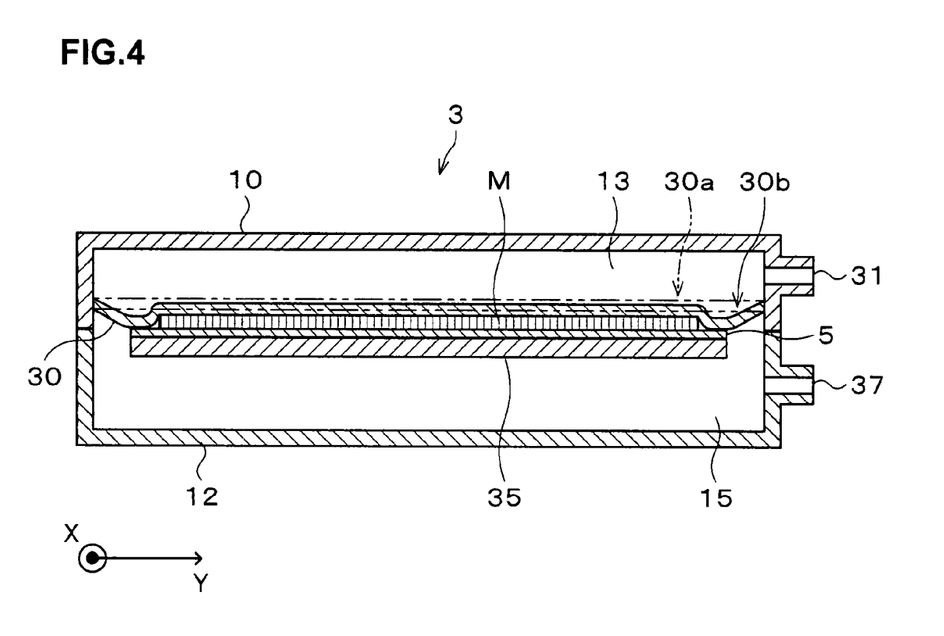
FIG. 4 is an explanatory view showing the operation of a laminating part.

FIG. 4 is a view showing the state where the laminating part 2 is hermetically closed by the upper case 10 being lowered from the state shown in FIG. 3 and in close contact with the upper surface of the lower case 12. When an internal pressure of the upper chamber 13 and an internal pressure of the lower chamber 15 are made different by using the inlet/outlet ports 31 and 37 in the hermetically closed state shown in FIG. 4 so that the former becomes higher than the latter, the diaphragm 30 changes from the state shown by the two-dot chain line 30a in FIG. 4 to the state shown by the solid line 30b in FIG. 4 and pushes the three objects to be laminated M against the heater panel 35, so that the sandwiched objects to be laminated M are pressed.

Figure 5:
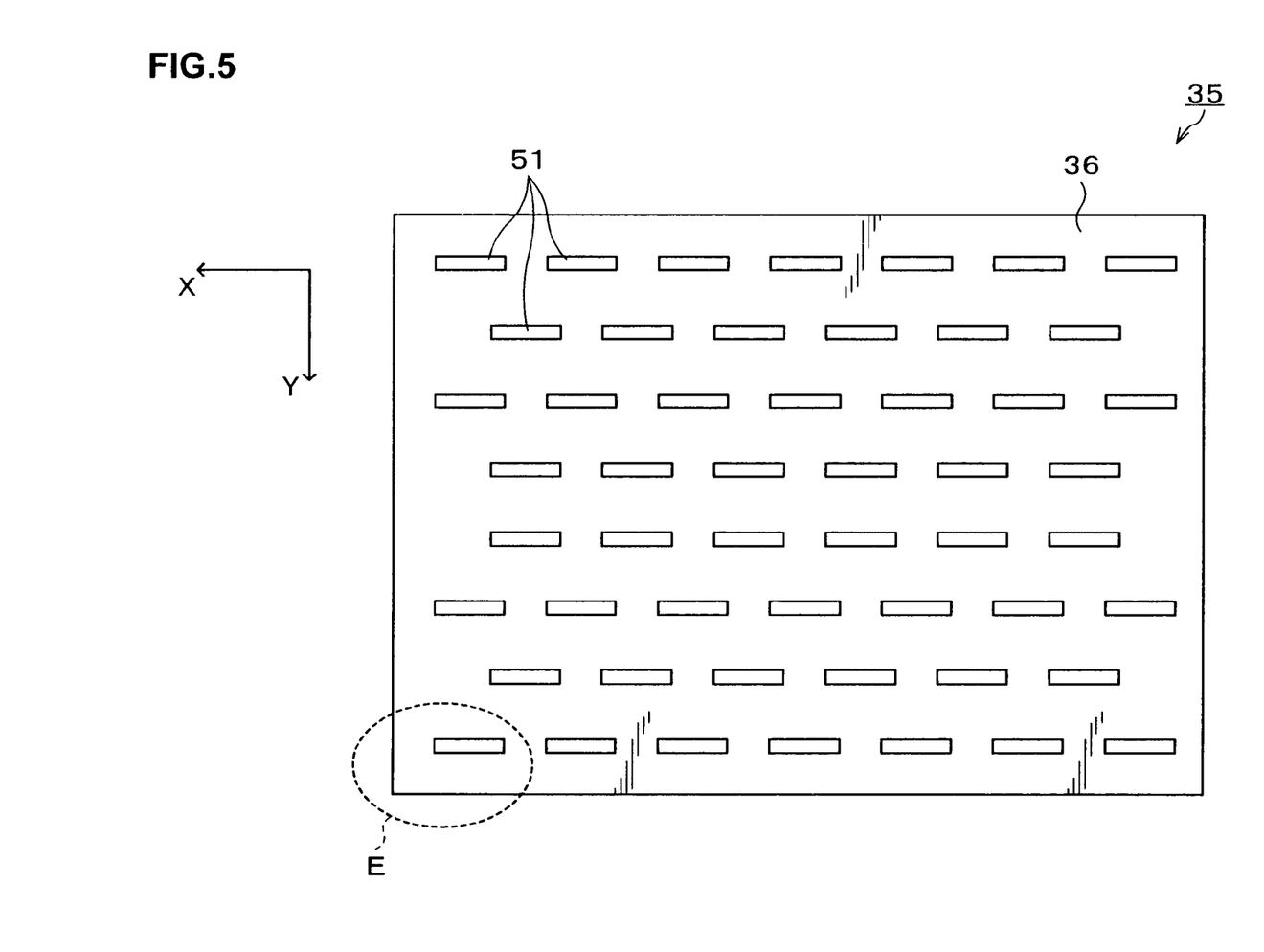
FIG. 5 is a plane view of a heater panel.

Next, the structure of the heater panel 35 will be described. FIG. 5 is a plane view of the heater panel 35. As shown in FIG. 5, the heater panel 35 is constituted by the metal plate 36 having the plural built-in heaters (not shown) having a shape which is long in the width direction Y. On an upper side of the metal plate 36, support parts 51 of a lift mechanism 50 lifting up/down the solar battery modules M via the conveying sheet 5 are provided to be movable up/down. In this embodiment, the number of the support parts 51 included in the lift mechanism 50 is 52, and these 52 support parts 51 are arranged in eight rows over the entire upper surface of the metal plate 36.

Figure 6:
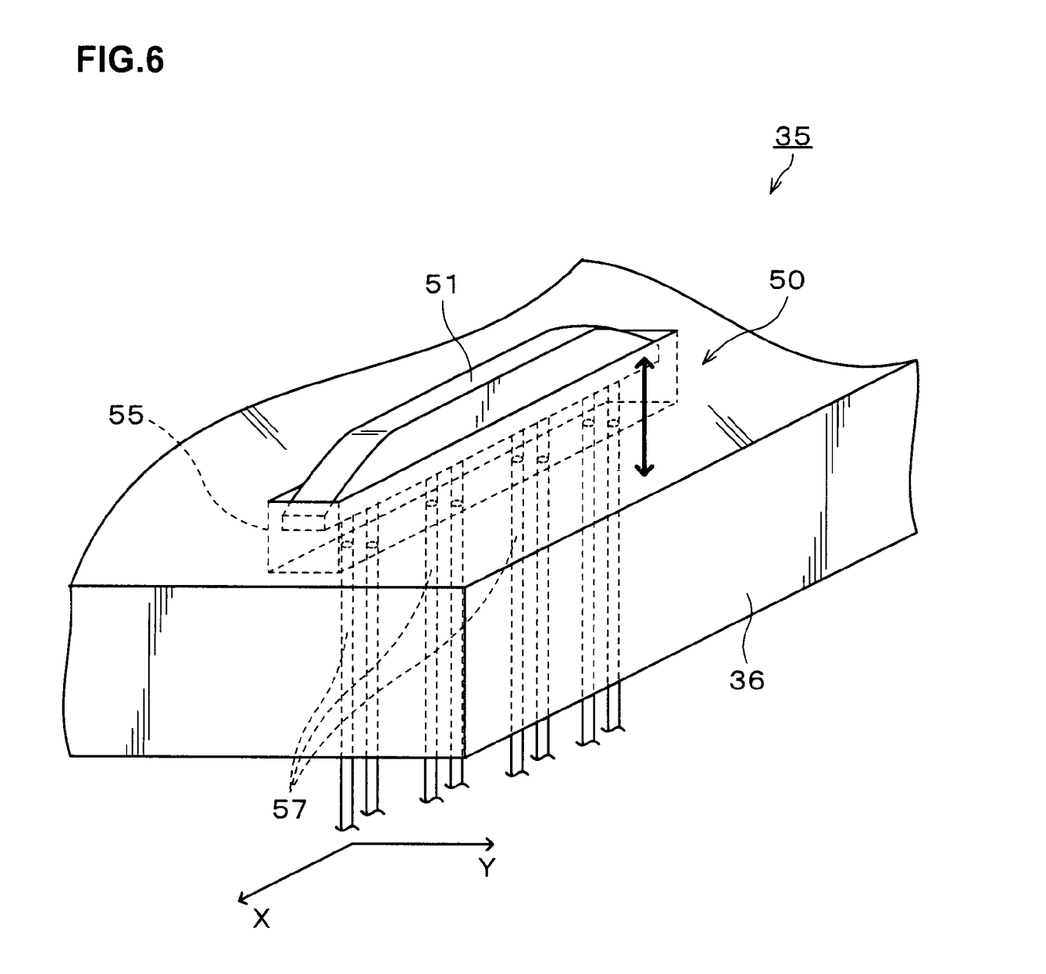
FIG. 6 is an enlarged perspective view of a support part provided in a corner portion of the heater panel in FIG. 5.
Figure 7:
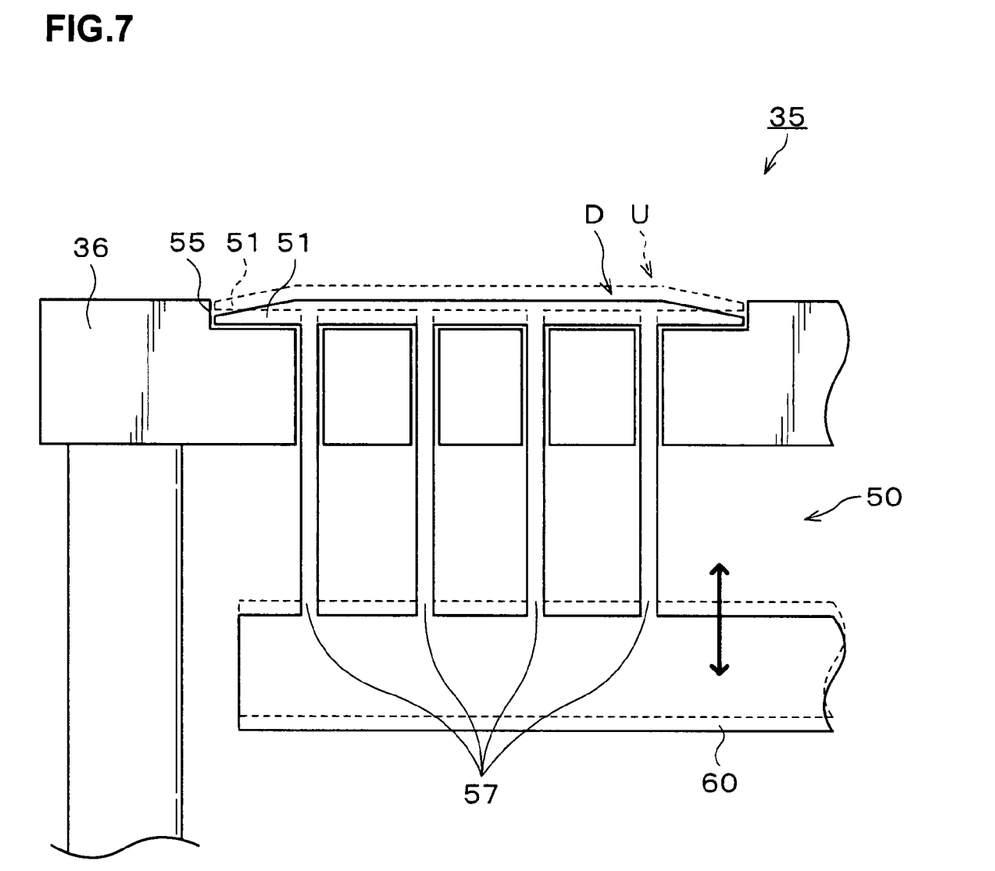
FIG. 7 is an enlarged sectional view showing the structure of the support part provided in the corner portion of the heater panel in FIG. 5.

FIG. 6 is an enlarged perspective view of the support part disposed in a corner portion E of the heater panel 35 in FIG. 5. FIG. 7 is an enlarged sectional view showing the support part 51 disposed in the corner portion E of the heater panel 35 in FIG. 5.

As shown in FIG. 6 and FIG. 7, the support part 51 of the lift mechanism 50 has a shape which is long in the loading/unloading direction X of the solar battery module M. On the upper side of the metal plate 36, rectangular parallelepiped recessed portions 55 substantially as large as the support parts 51 are formed at positions corresponding to the respective support parts 51, and the support parts 51 are movable up from or down to the inside of the recessed portions 51. In this embodiment, each of the support parts 51 is formed substantially in a rectangular parallelepiped shape, and a longitudinal center portion of its upper surface is horizontal. On the other hand, longitudinal both end portions of the support part 51 have a sloping shape so as to be lower than the longitudinal center portion.

As shown in FIG. 6, the support part 51 is formed to be movable up/down by, for example, eight shafts 57 vertically passing through the metal plate 36. In this embodiment, these shafts 57 are coupled to a horizontal support plate 60 moving up/down under the heater panel 35. The 52 support parts 51 of the lift mechanism 50 are all placed on the same support plate 60, and the up/down movement of the support plate 60 by a driving mechanism such as, for example, an air cylinder (not shown) enables the simultaneous up/down movement of all the 52 support parts 51. Alternatively, the support parts 51 may be coupled to the support plate 60.

As shown in FIG. 7, when the support plate 60 is in a lowered state, the support parts 51 are at a down position D and are housed in the recessed portions 55, and the center portions of the upper surfaces of the support parts 51 are substantially flush with the upper surface of the metal plate 36. Therefore, if the conveying sheet 5 is disposed on the heater panel 35 when the support parts 51 are in the lowered state at the down position D, the conveying sheet 5 becomes horizontal along the upper surface of the metal plate 36. On the other hand, when the support plate 60 is in a raised state, the support parts 51 are at an up position U and protrude from the upper surface of the metal plate 36. In this embodiment, when the support parts 51 are at the up position U, the center portions of the upper surfaces of the support parts 51 are positioned higher than the upper surface of the metal plate 36, and the both end portions of the upper surfaces of the support parts 51 are positioned lower than the upper surface of the metal plate 36. Therefore, if the conveying sheet 5 is disposed above the heater panel 35 when the support parts 51 are in the raised state at the up position U, the conveying sheet 5 is lifted up by being supported by the support parts 51 from under to be kept at an upper position apart from the heater panel 35.

Figure 8:
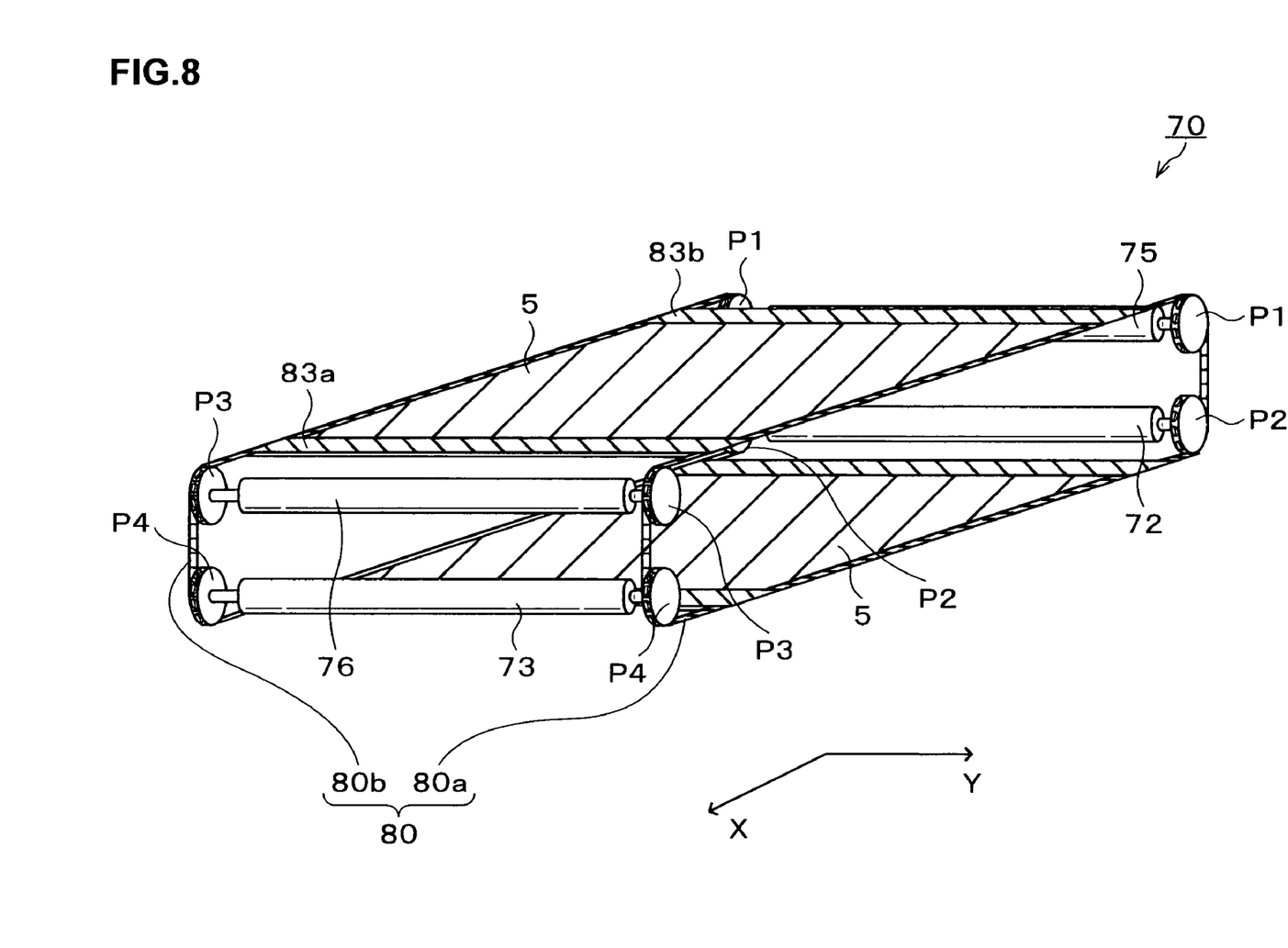
FIG. 8 is an explanatory perspective view showing the structure of a conveying sheet moving mechanism.

Next, a conveying system of the laminating apparatus 1 will be described. As shown in FIG. 1 and FIG. 2, the conveying sheet 5 capable of placing the solar battery modules M thereon move in circulation above and below the lower case 12 of the laminating unit 3 by the operation of a conveying sheet moving mechanism 70. FIG. 8 is an explanatory perspective view of the structure of the conveying sheet moving mechanism 70. As shown in FIG. 8, the conveying sheet moving mechanism 70 is structured such that an endless chain 80 is wound around a driving pulley P1 and driven pulleys P2 to P4 which are disposed outside the laminating part 2 on the right and left thereof. Each of these driving pulley P1 and driven pulleys P2 to P4 includes a pair of pulleys on whose outer circumferential surfaces sprockets engaged with the endless chain 80 are formed.

As shown in FIG. 8, the driving pulley P1 and the driven pulley 3 are provided at the same height, and thereunder, the driven pulley P2 and the driven pulley P4 are provided at the same height. The driven pulley P2 is provided under the driving pulley P1, and the driven pulley P4 is provided under the driven pulley P3. The endless chain 80 is composed of an endless chain 80a and an endless chain 80b. The endless chain 80a is wound around the pulleys on one side (right in FIG. 8) in the width direction Y of the heater panel 35, out of the pairs of the pulleys that the driving pulley P1 and the driven pulleys P2 to P4 have, and the endless chain 80b is wound around the pulleys on the other side (left in FIG. 8). Accordingly, when the driving pulley P1 is driven to rotate by a driving device (not shown), the endless chain 80 is driven via the sprockets to circulate, so that the driven pulleys P2 to P4 rotate together.

Between the endless chain 80a and the endless chain 80b, four crossbeam members 83a to 83d in a flat plate shape extending along the width direction Y of the heater panel 35 are provided at predetermined intervals. These crossbeam members 83a to 83d are fixed in such a manner that their both end portions in the width direction Y of the heater panel 35 have, for example, a hook shape and are hooked to the endless chains 80a, 80b. As shown in FIG. 8, the conveying sheets 5 are provided at two positions, i.e., between the crossbeam member 83a and the crossbeam member 83b and between the crossbeam member 83c and the crossbeam member 83d. The circulation movement of the endless chain 80 causes the crossbeam members 83a to 83d to circulate between the upper side and the lower side of the heater panel 35 together with the conveying sheets 5. In this embodiment, as shown in FIG. 2, when one of the two conveying sheets 5 is positioned right above the heater panel 35, the other conveying sheet 5 is positioned right under the heater panel 35.

As shown in FIG. 8, between the pair of pulleys constituting the driving pulley P1, a cylindrical conveyor roll 75 extending along the width direction Y of the heater panel 35 is provided. Between the pairs of pulleys constituting the respective driven pulleys P2 to P4, cylindrical conveyor rolls 72, 76, 73 extending along the width direction Y of the heater panel 35 are provided respectively. These conveyor rolls 75, 72, 76, 73 apply tension to the conveying sheets 5 when the conveying sheets 5 move from the upper side to the lower side or from the lower side to the upper side of the heater panel 35.

The surface of each of the conveying sheets 5 is preferably formed of a material excellent in removability to which the filler does not easily attach and from which the attached filler can be easily removed, in order to prevent the filler squeezed out of the solar battery modules M from adhering to the surface when the solar battery modules M in the sandwiched state are pressed by the diaphragm 30 in the laminating part 2. A heat-resistant glass cloth sheet or the like coated with, for example, Teflon® (fluorocarbon resin) is preferably used as the conveying sheet 5. Alternatively, the surface of the conveying sheet 5 may be coated with a material excellent in removability such as fluorocarbon resin, for example.

Figure 9:
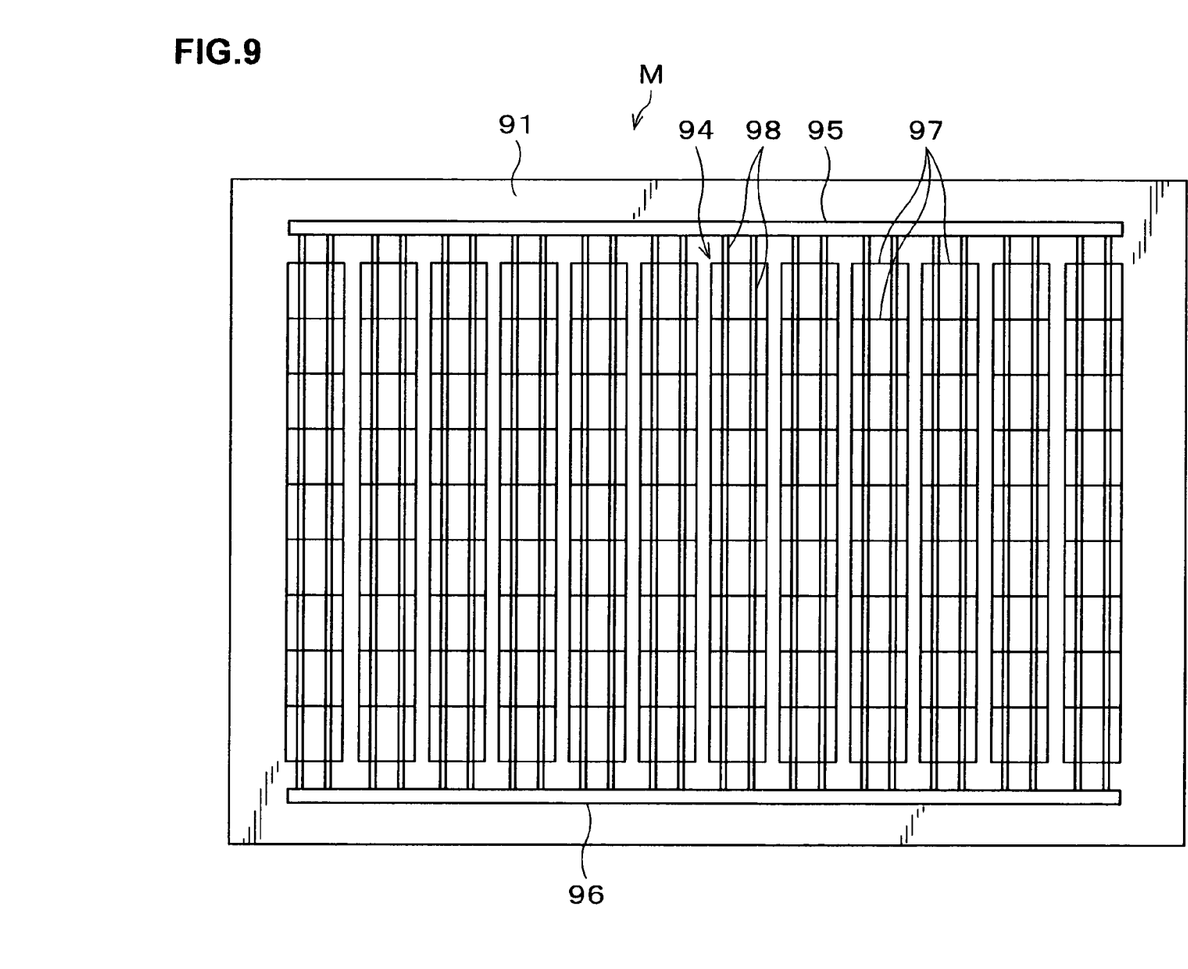
FIG. 9 is a plane view of a solar battery module.
Figure 10:
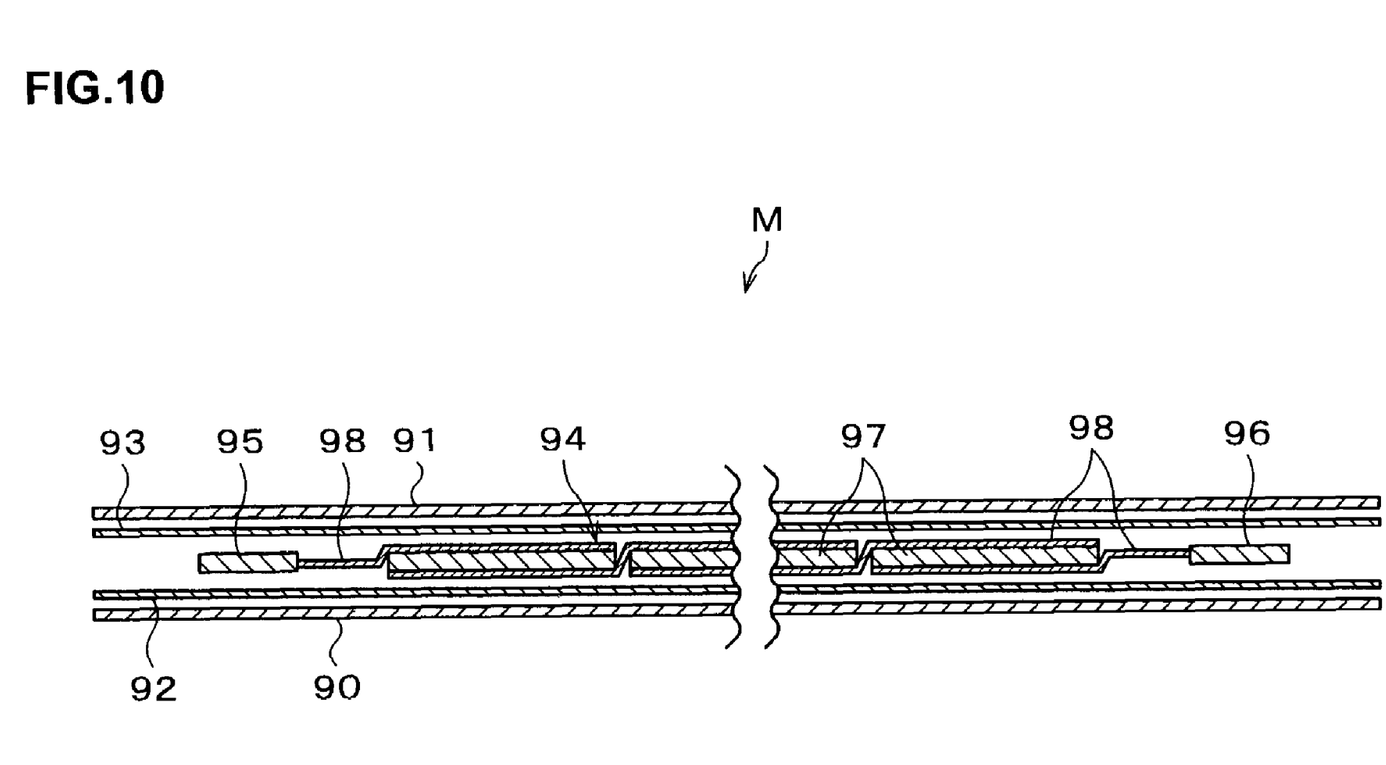
FIG. 10 is an enlarged sectional view of the solar battery module.

FIG. 9 and FIG. 10 show the solar battery module M as one example of the laminated object which is favorably produced by the laminating apparatus 1 of the present invention. As shown in FIG. 9, the solar battery module M is formed in a rectangular thin plate shape.

As shown in FIG. 10, the solar battery module M is structured such that strings 94 are sandwiched between a transparent cover glass 90 disposed on a lower side and a protective material 91 disposed on an upper side, via fillers 92 and 93. As the protective material 91, a transparent material such as PE resin is used, for instance. As the fillers 92 and 93, EVA (ethylene vinyl acetate) resin or the like is used, for instance. Each of the strings 94 includes solar battery cells 97 which are connected between electrodes 95 and 96 via lead wires 98. Front surfaces (light receiving surfaces) and back surfaces of the solar battery cells 97 are covered with the cover glass 90 on the lower side and with the protective material 91, respectively.

The solar battery module M as the laminated object structured as above is produced by the laminating apparatus 1 of the embodiment of the present invention according to the following procedure.

First, the solar battery modules M to be laminated are positioned on and supplied to the supply conveyor 6 which is disposed on the right of the laminating part 2 in FIG. 1, by means such as a robot not shown. The solar battery modules M are supplied to the supply conveyor 6 of the laminating apparatus 1, with the protective material 91 shown in FIG. 9 and FIG. 10 facing upward.

By the operation of the supply conveyor 6, the solar battery modules M supplied to the supply conveyor 6 are placed on the conveying sheet 5 which is set in advance on the right of the laminating part 2. When the driving pulley P1 is driven to circulate the endless chain 80, the solar battery modules M are conveyed into the laminating part 2 together with the conveying sheet 5. The heater panel 35 of the laminating part 2 is kept at a constant temperature (for example, 150° C. or 160° C.) by the built-in heaters (not shown), enabling uniform heating on the upper surface of the heater panel 35.

Before the solar battery modules M are conveyed into the laminating part 2 by the conveying sheet 5, it is necessary to open the laminating part 2 by lifting up the upper case 10. The operation of lifting up the upper case 10 is caused by the extension operation of the cylinders 22 described in FIG. 1. Further, the support parts 51 of the lift mechanism 50 are lifted up to be disposed at the up position U shown in FIG. 7 before the conveying sheet 5 reaches the laminating part 2.

When entering the laminating part 2, the conveying sheet 5 having the solar battery modules M thereon is conveyed thereto while being lifted up to the position above the heater panel 35 by the support parts 5 which have been positioned at the up position U. After the loading is finished and the conveying sheet 5 having the solar battery modules M thereon is disposed above the heater panel 35, the upper case 10 is lowered to hermetically close the laminating part 2. The operation of lowering the upper case 10 is caused by the contraction operation of the cylinders 22 described in FIG. 1. Then, the inside of the upper chamber 13 and the inside of the lower chamber 15 are simultaneously evacuated via the inlet/outlet ports 31, 37.

After the inside of the upper chamber 13 and the inside of the lower chamber 15 are evacuated to, for example, 0.7 Torr to 1.0 Torr, the support parts 51 of the lift mechanism 50 are lowered to the down position D in the lower chamber 15. Consequently, the conveying sheet 5 which has been lifted up becomes horizontal on the upper surface of the heater panel 35, and the solar battery modules M on the conveying sheet 5 are brought into thermal contact with the upper surface of the heater panel 35 to be heated. This heating promotes a chemical reaction of the EVA resin as the fillers 92, 93 in the solar battery modules M, causing bridging. Then, in this state, atmospheric pressure is introduced into the upper chamber 13 via the inlet/outlet port 31 to expand the diaphragm 30 downward in the laminating part 2 as shown in FIG. 4, whereby the solar battery modules M are sandwiched and pressed between the upper surface of the heater panel 35 and the diaphragm 30.

After the laminating treatment is finished by such heating and pressing to produce the solar battery modules M, atmospheric pressure is introduced into the lower chamber 15 via the inlet/outlet port 37. Then, after the support parts 51 of the lift mechanism 50 are lifted up to the up position U, the driving pulley P1 is driven to circulate the endless chain 80, so that the solar battery modules M is unloaded out of the laminating part 2 together with the conveying sheet 5. Further, the upper case 10 is lifted up to open the laminating part 2. The operation of lifting up the upper case 10 is caused by the extension operation of the cylinders 22 described in FIG. 1. The conveying sheet 5 having the solar battery modules M thereon is conveyed out of the laminating part 2 while being lifted up to the position above the heater panel 35 by the support parts 51 raised to the up position U.

The solar battery modules M having undergone the laminating treatment are unloaded to the unloading conveyor 7 disposed on the left of the laminating part 2 in FIG. 1, by the operation of the conveying sheet 5 and the unloading conveyor 7. Then, the solar battery modules M are taken out from the unloading conveyor 7 by means such as a robot not shown and are conveyed to the next process. Incidentally, when the solar battery modules M having undergone the laminating treatment are thus unloaded to the unloading conveyor 7, three solar battery modules M to be laminated next may be loaded into the laminating part 2 at the same time.

According to the above-described embodiment, when the solar battery modules M are loaded into the laminating part 2, the conveying sheet 5 having the solar battery modules thereon is lifted up to the position above the heater panel 35 to be made apart from the heater panel 35 by the upward movement of the support parts 51 of the lift mechanism 50, which can prevent the solar battery modules M from being heated by the heater panel 35 of the laminating part 2 before the completion of the loading of the solar battery modules M. This can eliminate a difference in heating time among the solar battery module M loaded first and the solar battery modules M loaded later, which enables heating of the plural solar battery modules M to uniform temperature. Further, it is possible to prevent the occurrence of air in the solar battery modules M which might be caused if the solar battery modules M were heated before the laminating treatment, and accordingly, it is possible to produce higher quality solar battery modules M than was possible conventionally.

Further, since each of the support parts 51 of the lift mechanism 50 is formed in a long shape and its longitudinal both end portions are lower than its longitudinal center portion, the conveying sheet 5 can be moved smoothly for loading/unloading, which can inhibit a trouble that might occur, for example, if the conveying sheet 5 should catch on the support parts 51. In particular, by setting the up position U of the support parts 51 of the lift mechanism 50 to the position where the support parts 51 are not completely lifted up to the position above the recessed portions 55 as shown in FIG. 7, it is possible to more smoothly move the conveying sheet 5.

Moreover, since the support parts 51 of the lift mechanism 50, when at the down position D, are housed in the recessed portions 55 provided in the upper surface of the heater panel 35, the installation space can be saved. Further, when the support parts 51 are in the lowered state, the upper surface of the heater panel 35 can be flat, which enables uniform heating of the solar battery modules M.

Hitherto, a preferred embodiment of the present invention has been described with reference to the attached drawings, but the present invention is not limited to such an example. It is obvious that those skilled in the art could reach various modification examples and corrected examples within the technical idea described in the claims, and it should be understood that these examples also belong to the technical scope of the present invention.

The above embodiment describes the case where the number of the support parts 51 of the lift mechanism 50 lifting up/down the conveying sheet 5 is 52, but the number of the support parts 51 may be any. Further, the support parts 51 may be arranged and structured in any manner.

The above embodiment describes the case where each of the support parts 51 of the lift mechanism 50 has a shape which is long in the loading/unloading direction of the solar battery module M, but the support part 51 may have any shape.

The above embodiment describes the case where the recessed portions 55 in which the support parts 51 of the lift mechanism 50 are housed when lowered to the down position D are formed at the positions corresponding to the support parts 51 to have substantially the same size as the support parts 51, but the recessed portions 55 may have any shape. Further, the recessed portions 55 in which the support parts 51 are housed when lowered to the down position D are not indispensable.

The above embodiment describes the case where all the support parts 51 of the lift mechanism 50 are placed on or coupled to the same support plate 60 under the heater panel 35, but the support parts 51 may have other structures, for example, they may be separately movable.

The above embodiment describes the case where the conveying sheet moving mechanism 70 is driven by the endless chain 80, but a driving mechanism other than the endless chain 80, such as a conveying belt may be used. Further, the case where the two conveying sheets 5 are used is described, but any number of the conveying sheets 5 may be used. For example, the single conveying sheet 5 may be formed in an endless form similarly to the endless chain 80.

The above embodiment describes the case where the three solar battery modules M as the objects to be laminated are simultaneously loaded/unloaded by the conveying sheet moving mechanism 70 to be simultaneously laminated, but any number of the solar battery modules M may be simultaneously loaded/unloaded and laminated.

The present invention is especially useful as a laminating apparatus laminating an object to be laminated such as, for example, a translucent substrate, a filler, and a solar battery element to produce a solar battery module.

What is claimed is:

1. A laminating apparatus for laminating an object to be laminated in a laminating part which has a diaphragm on an upper side and a heater panel on a lower side, by melting a filler in the object to be laminated and pressing the object to be laminated sandwiched between the diaphragm and the heater panel, the apparatus comprising:
    a conveying sheet operative for conveying the object to be laminated placed on the conveying sheet into and out of the laminating part; and
    a lift mechanism operative for lifting up/down a support part capable of supporting said conveying sheet from the lower side,
    wherein
    the support part has a shape which is elongated in a loading/unloading direction of the object to be laminated,
    in an upper surface of the support part, longitudinal both end portions are lower than a longitudinal center portion,
    in an upper surface of the support part, a longitudinal center portion is horizontal,
    longitudinal both end portions of the support part have a sloping shape so as to be lower than the center portion, and
    on an upper side of the heater panel, a rectangular parallelepiped recessed portion substantially as large as the support part is formed.

2. The laminating apparatus according to claim 1, wherein said lift mechanism has a plurality of support parts, and the plurality of support parts are coupled to a common support plate moving up/down under the heater panel.

3. The laminating apparatus according to claim 1, wherein the support part is housed in the heater panel when in the lowered state.

4. The laminating apparatus according to claim 1, wherein the object to be laminated is a solar battery module.

* * * * *